(12) United States Patent
Mouri et al.

(10) Patent No.: US 7,898,451 B2
(45) Date of Patent: Mar. 1, 2011

(54) ANALOG-TO-DIGITAL CONVERTER, OPTICAL DISK REPRODUCTION DEVICE, AND RECEIVER DEVICE

(75) Inventors: Hiroki Mouri, Osaka (JP); Kouichi Nagano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/597,881

(22) PCT Filed: Feb. 10, 2009

(86) PCT No.: PCT/JP2009/000540
§ 371 (c)(1),
(2), (4) Date: Oct. 27, 2009

(87) PCT Pub. No.: WO2009/157111
PCT Pub. Date: Dec. 30, 2009

(65) Prior Publication Data
US 2010/0194618 A1    Aug. 5, 2010

(30) Foreign Application Priority Data

Jun. 24, 2008    (JP) ................. 2008-164815

(51) Int. Cl.
H03M 1/36    (2006.01)
(52) U.S. Cl. ........................ 341/159; 341/155
(58) Field of Classification Search .................. 341/159
See application file for complete search history.

(56) References Cited

U.S. PATENT DOCUMENTS

| 4,216,465 A | 8/1980 | Huelsman et al. |
| 4,251,802 A | 2/1981 | Horna |
| 4,774,498 A | 9/1988 | Traa |
| 4,897,657 A * | 1/1990 | Brubaker ................. 341/159 |
| 5,519,398 A | 5/1996 | Satoh et al. |
| 5,668,549 A | 9/1997 | Opris et al. |
| 6,034,631 A * | 3/2000 | Gross, Jr. .................. 341/160 |
| 6,101,376 A * | 8/2000 | Bell ........................... 455/218 |
| 6,222,476 B1 * | 4/2001 | Lee et al. .................. 341/159 |
| 6,535,152 B2 | 3/2003 | Lee |

FOREIGN PATENT DOCUMENTS

| JP | 63-202131 | 8/1988 |
| JP | 63-234730 | 9/1988 |
| JP | 6-125275 | 5/1994 |
| JP | 09-139672 | 5/1997 |
| JP | 2002-008315 | 1/2002 |
| JP | 2006-252630 | 9/2006 |

* cited by examiner

OTHER PUBLICATIONS

Front page of Published International Application and International Search Report issued in International Application No. PCT/JP2009/000540 filed Feb. 10, 2009.

*Primary Examiner* — Khai M Nguyen
(74) *Attorney, Agent, or Firm* — McDermott Will & Emery LLP

(57) ABSTRACT

A plurality of comparators (CMP1, CMP2, ... ) respectively correspond to a plurality of reference voltages (V1, V2, ... ), and each compares a reference voltage corresponding to the comparator with a signal level of an analog signal (Sin). An encoder (102) generates a digital signal (De) corresponding to the analog signal (Sin) based on outputs (S1, S2, ... ) of the plurality of comparators. A pattern detection circuit (103) detects that a temporal change of an output (S3) of a first comparator matches a predetermined first particular pattern. A control circuit (104) corrects a digital value of the digital signal (De) in response to detection by the pattern detection circuit. The temporal change of the output (S3) of the first comparator becomes the first particular pattern when an amplitude of the analog signal (Sin) is smaller than a predetermined amplitude.

9 Claims, 13 Drawing Sheets

FIG.2

| Input Patterns | | | | | | | Digital Values |
|----|----|----|----|----|----|----|----|
| S1 | S2 | S3 | S4 | S5 | S6 | S7 | |
| 1 | 1 | 1 | 1 | 1 | 1 | 1 | 7 (1 1 1) |
| 0 | 1 | 1 | 1 | 1 | 1 | 1 | 6 (1 1 0) |
| 0 | 0 | 1 | 1 | 1 | 1 | 1 | 5 (1 0 1) |
| 0 | 0 | 0 | 1 | 1 | 1 | 1 | 4 (1 0 0) |
| 0 | 0 | 0 | 0 | 1 | 1 | 1 | 3 (0 1 1) |
| 0 | 0 | 0 | 0 | 0 | 1 | 1 | 2 (0 1 0) |
| 0 | 0 | 0 | 0 | 0 | 0 | 1 | 1 (0 0 1) |
| 0 | 0 | 0 | 0 | 0 | 0 | 0 | 0 (0 0 0) |

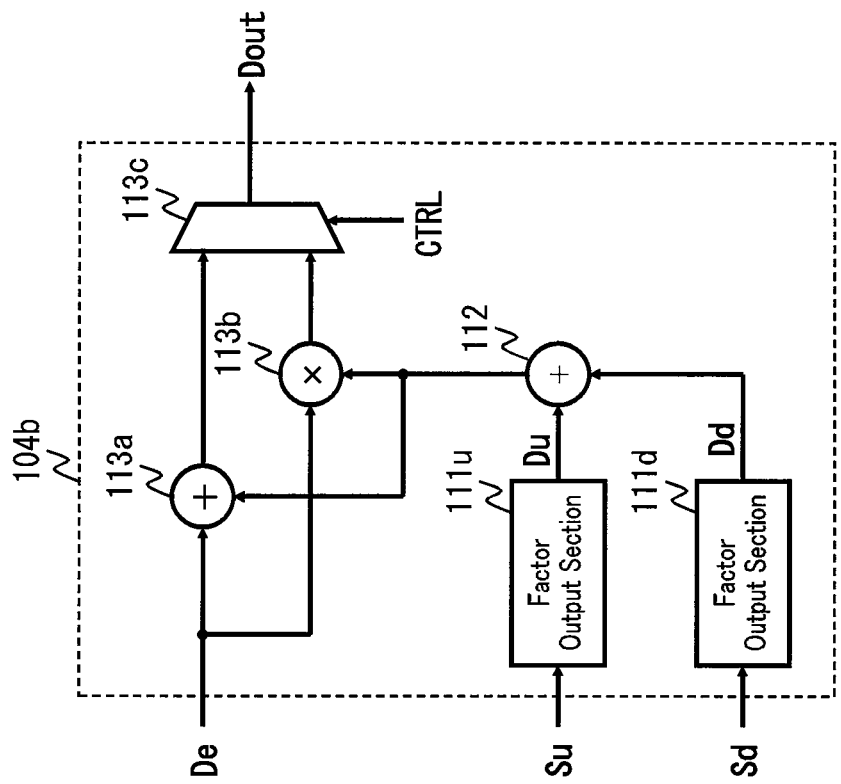
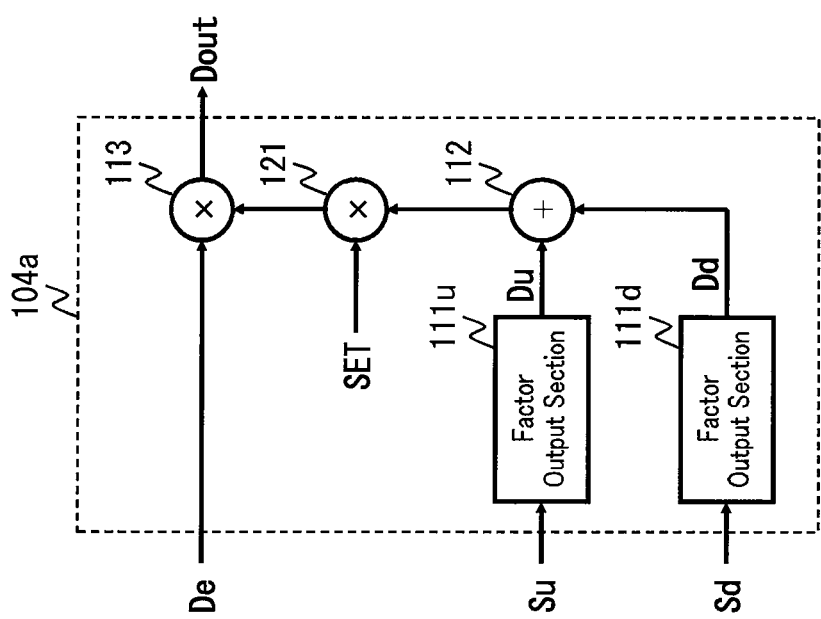

ANALOG-TO-DIGITAL CONVERTER, OPTICAL DISK REPRODUCTION DEVICE, AND RECEIVER DEVICE

RELATED APPLICATIONS

This application is the U.S. National Phase under 35 U.S.C. §371 of International Application No. PCT/JP2009/000540, filed on Feb. 10, 2009, which in turn claims the benefit of Japanese Application No. 2008-164815, filed on Jun. 24, 2008, the disclosures of which applications are incorporated by reference herein.

TECHNICAL FIELD

The present invention relates to analog-to-digital (A/D) converters which convert analog signals to digital signals, and signal processing devices including the same. More particularly, the present invention relates to waveform equalization technology in A/D converters.

BACKGROUND ART

Conventionally, waveform equalization circuits, error correction circuits, and/or the like have been used to process small amplitude signals with high accuracy. In the field of optical disks, Partial Response Maximum Likelihood (PRML) read channel technology is generally used to improve the accuracy of data reading. In this technology, a waveform equalization process, which allows the waveform of a digital signal to become a predetermined waveform using a digital waveform equalization circuit such as a transversal filter, and a maximum-likelihood decoding process, which performs error correction by using a maximum-likelihood decoding method for the digital signal after the waveform equalization process, are performed. For example, in Patent Document 1, an analog filter capable of amplifying an amplitude in a particular frequency band corrects the waveform of an reproduced signal (an analog signal) reproduced from an optical disk, an analog-to-digital (A/D) converter converts the corrected reproduced signal into a digital signal, and a transversal filter and a maximum-likelihood decoder respectively perform the waveform equalization process and the maximum-likelihood decoding process. Thus, in Patent Document 1, an analog waveform equalization circuit is used to correct amplitudes of analog signals supplied to an A/D converter, and the transversal filter (an digital waveform equalization circuit) is used for waveform equalization process of digital signals. Additionally, Japanese Unexamined Patent Application Publication No. S63-234730 discloses technologies for error detection and error correction within an A/D converter.

Patent Document 1: Japanese Unexamined Patent Application Publication No. 2002-8315
Patent Document 2: Japanese Unexamined Patent Application Publication No. S63-234730

SUMMARY OF THE INVENTION

Technical Problem

However, in Patent Document 1, the digital waveform equalization circuit includes a large number of components such as multipliers, adders, and registers, thereby making it difficult to realize a reduction in circuit size as well as a reduction in power consumption of a system including the digital waveform equalization circuit. Since the analog waveform equalization circuit also includes a large number of components, there is performance degradation due to variation in elements, in addition to similar issues to those of the digital waveform equalization circuit.

Moreover, since A/D converters described in Patent Document 2 are directed to correcting errors in digital signals, if the amplitudes of analog signals have been attenuated, a digital signal with desired waveform cannot be output. Therefore, even if an A/D converter described in Patent Document 2 is used, a waveform equalization circuit as described above will be required, causing the above-mentioned issues to occur.

Accordingly, it is an objective of the present invention to provide an A/D converter having waveform equalization functionality.

Solution to the Problem

In accordance with an aspect of the present invention, an A/D converter includes a plurality of comparators, which respectively correspond to a plurality of reference voltages which have different voltage levels, and each of which compares a reference voltage corresponding to the comparator with a signal level of an analog signal, an encoder which generates a digital signal corresponding to the analog signal based on outputs of the plurality of comparators, a pattern detection circuit which detects that a temporal change of an output of a first comparator of the plurality of comparators matches a predetermined first particular pattern, and a control circuit which corrects a digital value of the digital signal in response to detection by the pattern detection circuit, such that the waveform of the digital signal corresponds to a predetermined waveform, where the temporal change of the output of the first comparator becomes the first particular pattern when an amplitude of the analog signal is smaller than a predetermined amplitude. In the A/D converter described above, by monitoring temporal changes of the output of the first comparator, digital values of the digital signal can be corrected with appropriate timing. Thus, A/D converters are provided with waveform equalization functionality, thereby eliminating the need for including a waveform equalization circuit, then allowing for a reduction in circuit size and a reduction in power consumption of a device including a digital waveform equalization circuit.

Preferably, the pattern detection circuit includes a first detection section which detects that the temporal change of the output of the first comparator matches the first particular pattern, and a second detection section which detects that a temporal change of an output of a second comparator, corresponding to a reference voltage lower than the reference voltage of the first comparator, of the plurality of comparators matches a predetermined second particular pattern, where the temporal change of the output of the first comparator becomes the first particular pattern when a maximum peak of the amplitude of the analog signal is lower than a maximum peak of the predetermined amplitude, and the temporal change of the output of the second comparator becomes the second particular pattern when a minimum peak of the amplitude of the analog signal is higher than a minimum peak of the predetermined amplitude. In addition, the control circuit increases the digital value in response to the detection by the first detection section, and decreases the digital value in response to the detection by the second detection section. In the A/D converter described above, by monitoring respective temporal changes of the first and the second comparators, digital values of the digital signal can be increased or decreased with appropriate timing so as to allow the waveform of the digital signal to become a predetermined waveform.

ADVANTAGES OF THE INVENTION

As described above, a reduction in circuit size as well as a reduction in power consumption of a device including an A/D converter can be realized.

BRIEF DESCRIPTION OF DRAWINGS

FIG. 2 is a diagram illustrating one example of a conversion table in the encoder shown in FIG. 1.

FIGS. 5A and 5B are diagrams for explaining variations of the control circuit shown in FIG. 1.

Figure 1:
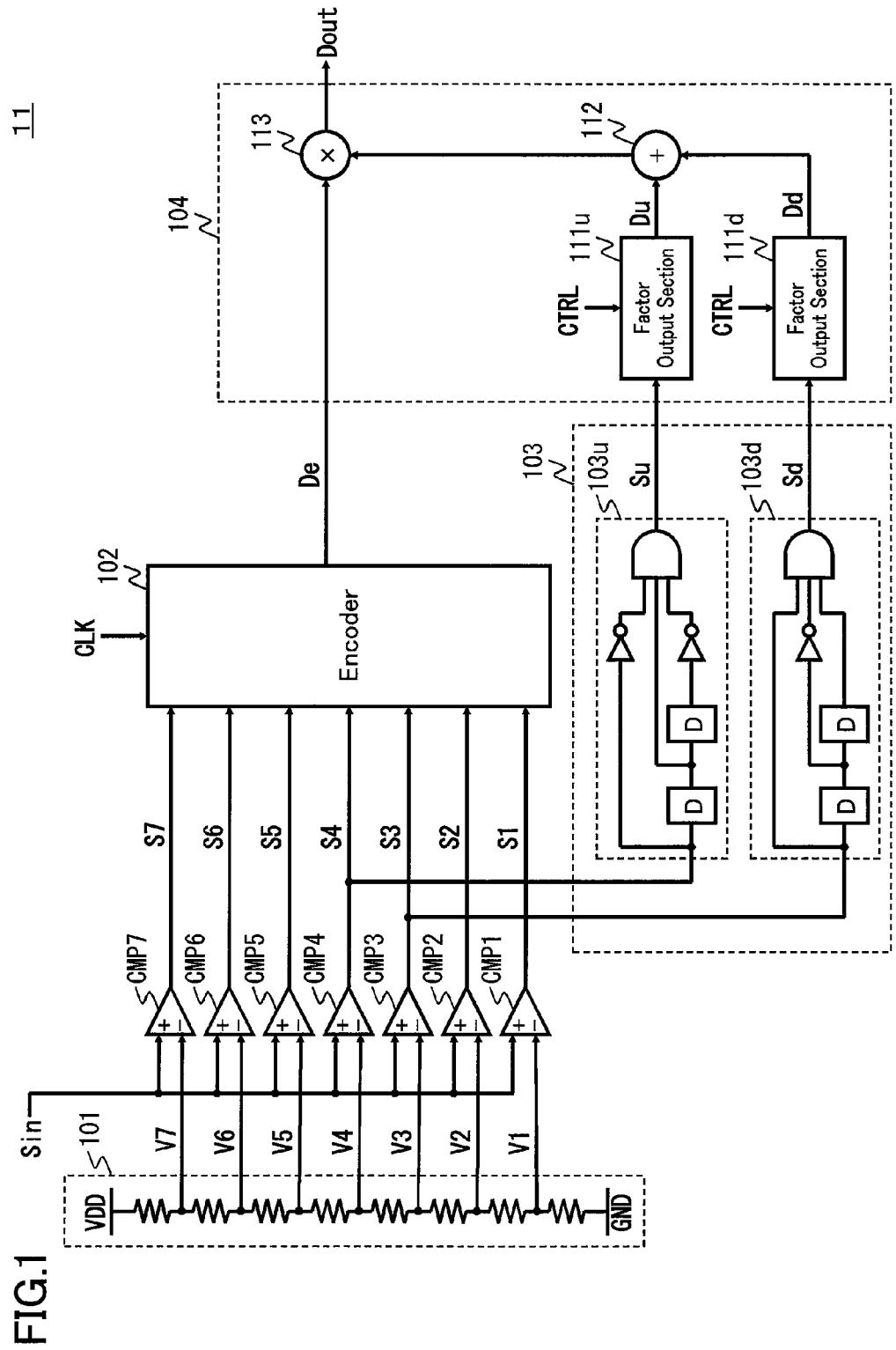
FIG. 1 is a diagram illustrating an example structure of an A/D converter in accordance with the embodiment 1.

DESCRIPTION OF REFERENCE CHARACTERS 11, 21, 31 A/D Converter
101 Reference Voltage Generation Circuit
CMP1, CMP2, . . . , and CMP 7 Comparator
102 Encoder
103 Pattern Detection Circuit
103$d$, 103$u$, 503$d$, 503$u$ Detection Section
104, 104$a$, 104$b$ Control Circuit
111$d$, 111$u$ Factor Output Section
112 Adder
113 Multiplier
204 Control Circuit
211 Hold Circuit
212 Operation Circuit
300 Offset Detection Circuit
301, 302, . . . , and 307 Detection Section
310 Decision Section

BEST MODE FOR CARRYING OUT THE INVENTION

Preferred embodiments of the present invention will be described below in detail with reference to the drawings. Note that same or similar elements in the drawings are assigned with same reference symbols, and their explanations are omitted.

Embodiment 1

FIG. 1 illustrates an example structure of an analog-to-digital (A/D) converter in accordance with the embodiment 1 of the present invention. This A/D converter 11 has A/D conversion functionality which converts an analog signal Sin to a digital signal Dout, and wave equalization functionality which corrects the waveform of the digital signal Dout to a predetermined waveform. The A/D converter 11 includes a reference voltage generation circuit 101, n (where n is an integer greater than or equal to 2; here, n=7) comparators CMP1, CMP2, . . . , and CMP 7, an encoder 102, a pattern detection circuit 103, and a control circuit 104.

The reference voltage generation circuit 101 generates n reference voltages V1, V2, . . . , and V7 each having different voltage level. For example, the reference voltage generation circuit 101 has a ladder resistor connected between a power supply node, to which a power supply voltage VDD is supplied, and a ground node, to which a ground voltage GND is supplied. The comparators CMP1, CMP2, . . . , and CMP 7 respectively correspond to reference voltages V1, V2, . . . , and V7, compare the reference voltage corresponding to the comparator with the signal level of the analog signal Sin, and output the comparison results as comparison signals S1, S2, . . . , and S7. The encoder 102, in synchronization with a clock signal CLK, sequentially outputs digital values which correspond to input patterns indicated by respective signal levels of the comparison signals S1, S2, . . . , and S7, thereby generating n levels (here, 8 levels) of a digital signal De which correspond to the analog input Sin. For example, the encoder 102 outputs a digital value corresponding to an input pattern based on a conversion table as shown in FIG. 2, as the digital signal De.

Figure 4:
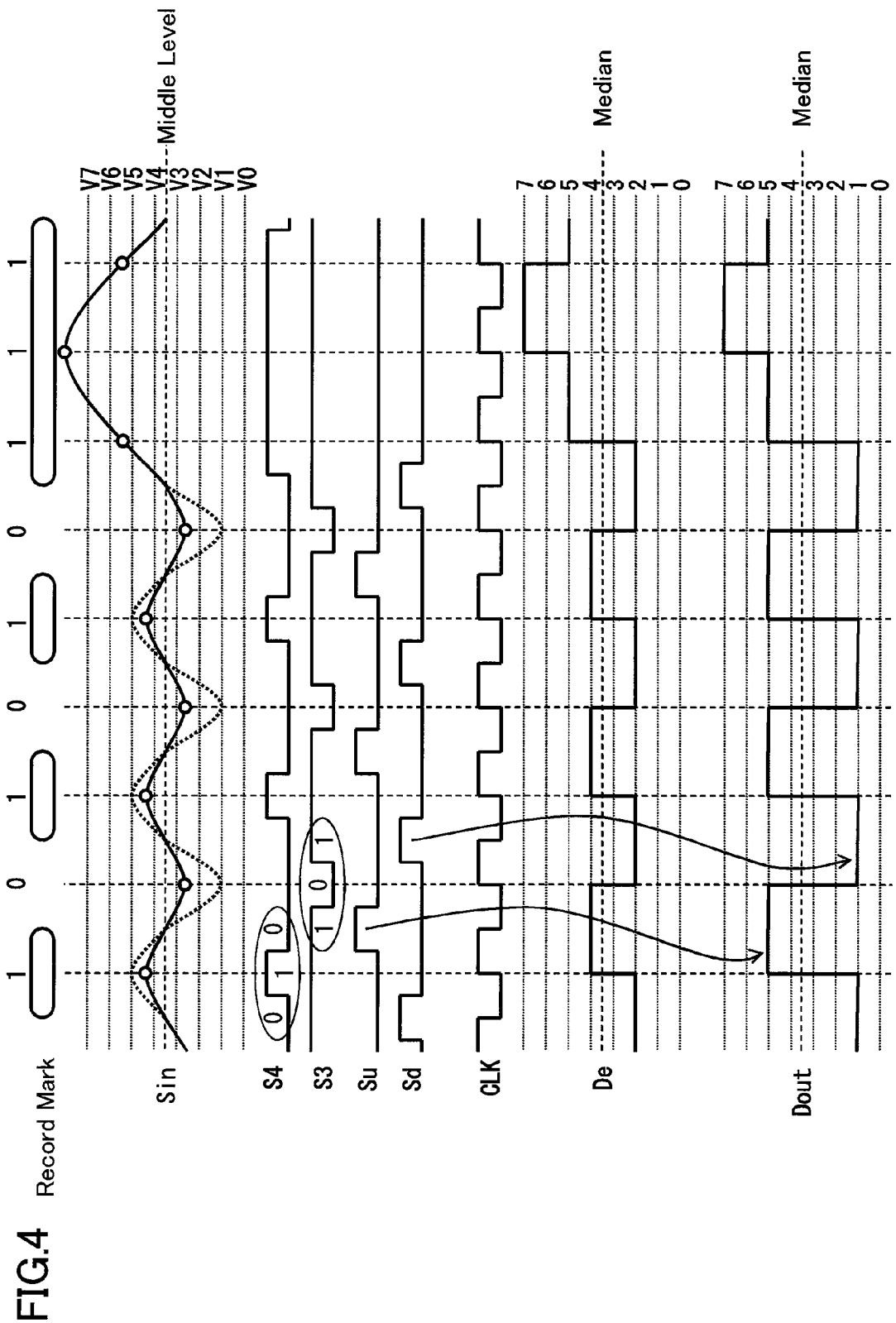
FIG. 4 is a timing chart for explaining the operation by the A/D converter shown in FIG. 1.

The analog signal Sin will now be described. The analog signal Sin has amplitude characteristics that a higher frequency will result in a smaller amplitude. Therefore, when the amplitude of the analog signal Sin is smaller than a predetermined amplitude (e.g., an amplitude of a level which is recognizable in a downstream circuit), the A/D converter 11 performs a waveform equalization process. Here, the waveform equalization process is utilized for a condition where a lowest peak of the amplitude of the analog signal Sin is higher than the reference voltage V2, and a highest peak is lower than the reference voltage V5, that is, a condition where the amplitude of the analog signal Sin is smaller than the potential difference between the reference voltages V2 and V5 (small amplitude state) as shown in FIG. 4. In addition, if the analog signal Sin is in a small amplitude state, then a temporal change of the comparison signal S3 represents a pattern of "101," and a temporal change of the comparison signal S4 represents a pattern of "010."

Now returning to FIG. 1, the pattern detection circuit 103 determines whether a waveform equalization process is required or not by using the fact that when the analog signal Sin is in a small amplitude state, a temporal change of a particular comparison signal represents a particular pattern. Here, the pattern detection circuit 103 includes detection sections 103$d$ and 103$u$. The detection section 103$d$ outputs a detection signal Sd, when it detects that a temporal change of the comparison signal S3 matches a particular pattern "101." For example, the detection section 103$d$ includes two delay circuits connected in cascade to convert the temporal change of the comparison signal S3 into time series data, and a logic circuit (one inverter and one AND circuit) to set the detection signal Sd to "1" when the time series data (i.e., the comparison signal S3, the output of the first stage of the delay circuits, and the output of the second stage of the delay circuits)

represents the particular pattern "101." The detection section 103u outputs a detection signal Su, when it detects that a temporal change of the comparison signal S4 matches a particular pattern "010." For example, the detection section 103u includes two delay circuits, two inverters, and one AND circuit.

The control circuit 104 corrects digital values of the digital signal De such that the waveform of the digital signal De becomes a predetermined waveform in response to the detection signals Sd and Su, and outputs the corrected digital signal De as the digital signal Dout. The control circuit 104 includes factor output sections 111d and 111u, an adder 112, and a multiplier 113. The factor output section 111d outputs an correction factor Dd when the detection signal Sd has been output. The factor output section 111u outputs an correction factor Du when the detection signal Su has been output. The correction factor Dd is a factor which represents the degree of decrease of the digital value of the digital signal De, and the correction factor Du is a factor which represents the degree of increase of the digital value of the digital signal De. In addition, the correction factors Dd and Du are configurable by means of an external control CTRL. The multiplier 113 multiplies the digital values of the digital signal De by the correction factors Dd and Du supplied via the adder 112. Due to this, the digital values of the digital signal De are corrected to digital values corresponding to a predetermined waveform.

[Optical Disk Reproduction Device]

Figure 3:
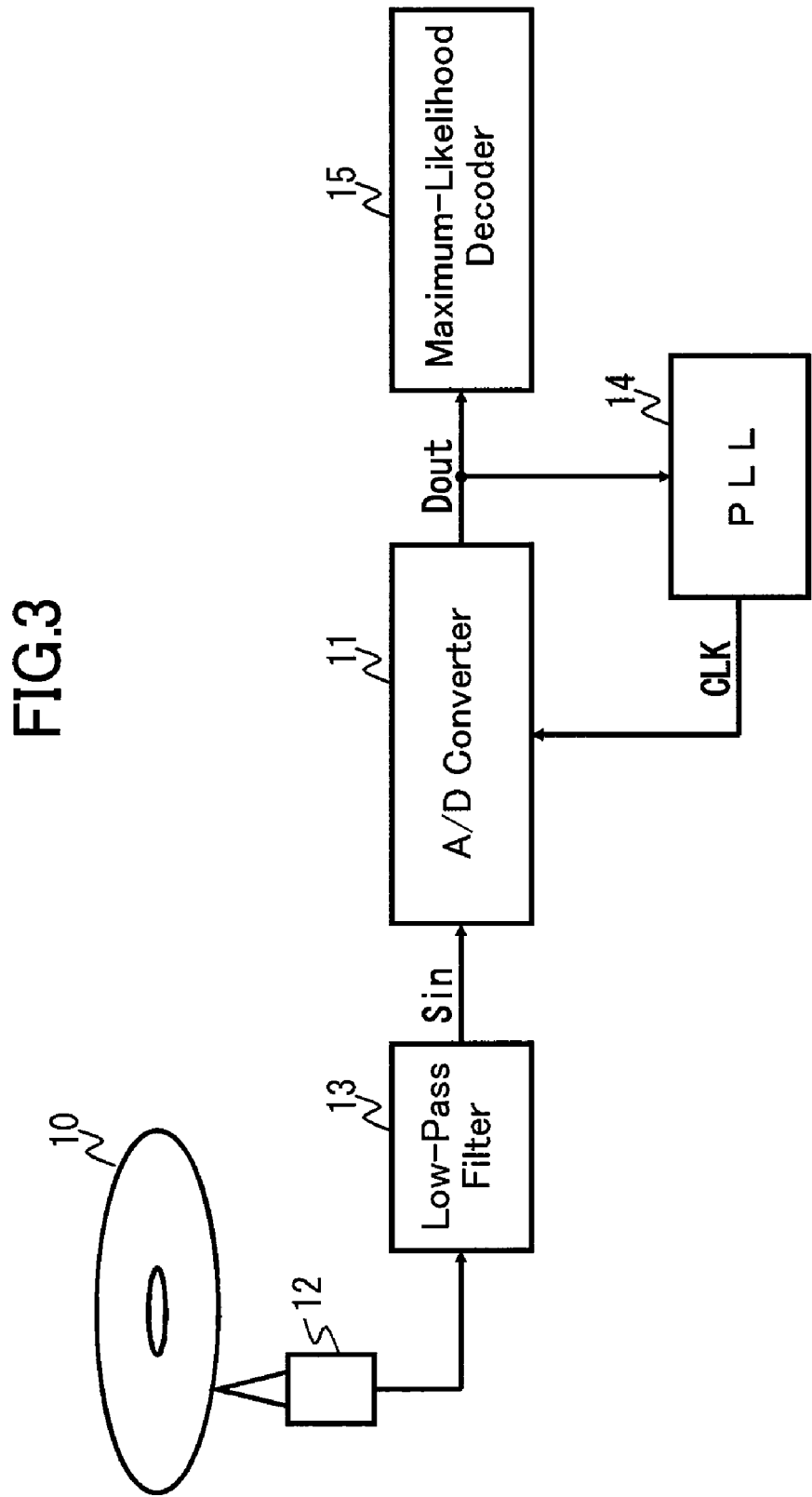
FIG. 3 is a diagram illustrating an example structure of an optical disk reproduction device having the A/D converter shown in FIG. 1.

As shown in FIG. 3, the A/D converter 11 shown in FIG. 1 can be applied to optical disk reproduction devices. An optical disk reproduction device shown in FIG. 3 reproduces information recorded on an optical disk 10 (e.g., a CD, a DVD, a Blu-ray disk, or the like), and includes, in addition to the A/D converter 11, a reproduction circuit 12, a low-pass filter 13, a PLL 14, and a maximum-likelihood decoder 15. The reproduction circuit 12 reproduces information recorded on the optical disk 10, as an analog signal. The low-pass filter 13 allows only low-frequency components of the analog signal reproduced by the reproduction circuit 12 to pass through. The A/D converter 11 converts the analog signal Sin passed through the low-pass filter 13 to a digital signal Dout having a predetermined waveform (e.g., a digital signal having PR characteristics). PLL 14 generates a clock signal CLK (a channel clock) synchronized to the analog signal Sin, based on the digital signal Dout from the A/D converter 11. The maximum-likelihood decoder 15 performs maximum-likelihood decoding on the digital signal Dout.

When information (a data bit string) is recorded on the optical disk 10, the information is converted into a modulated signal to satisfy a predetermined run-length limited rule, and record marks are written onto the optical disk based on the modulated signal. A smaller run-length value results in a higher frequency and a smaller amplitude of a signal component corresponding to the run-length. For example, in cases of a Blu-ray disk, the run-length of the modulated signal is limited so that the minimum run-length (the minimum inversion interval) and the maximum run-length (the maximum inversion interval) are 2T (T is channel time) and 8T respectively. Of a reproduced signal reproduced from a Blu-ray disk, the amplitude of a 2T signal component (a signal component corresponding to the minimum run-length) is much smaller than the amplitude of an 8T signal component (a signal component corresponding to the maximum run-length).

[Operation]

Next, referring to FIG. 4, operation of the A/D converter 11 shown in FIG. 3 will be described. It is assumed here that the optical disk 10 is a Blu-ray disk. That is, it is assumed that the minimum run-length is "2T," and that the 2T signal component of the analog signal Sin is a target of waveform equalization process. The correction factors Dd and Du are assumed to be "0.5" and "1.25" respectively.

When a temporal change of the comparison signal S4 represents a particular pattern "010," the detection signal Su changes from "0" to "1." Accordingly, a digital value "4" of the digital signal De is multiplied by the correction factor Du, which represents "1.25," and as a result, the digital value of the digital signal Dout becomes "5." Thus, digital values of the digital signal De can be increased with appropriate timing.

When a temporal change of the comparison signal S3 represents a particular pattern "101," the detection signal Sd changes from "0" to "1." Accordingly, a digital value "2" of the digital signal De is multiplied by the correction factor Dd, which represents "0.5," and as a result, the digital value of the digital signal Dout becomes "1." Thus, digital values of the digital signal De can be decreased with appropriate timing.

During a time period where neither of the temporal changes of the comparison signals S3 and S4 represents a particular pattern, digital values of the digital signal De are not corrected, and are each output as the digital signal Dout. That is, no waveform equalization process is performed.

As described above, by monitoring respective temporal changes of the comparison signals S3 and S4, digital values of the digital signal De can be corrected with appropriate timing, and the waveform of the digital signal De can become a predetermined waveform. Thus, since the A/D converter 11 has waveform equalization functionality, waveform equalization circuits are not required to be provided in either upstream or downstream of the A/D converter. Furthermore, since the pattern detection circuit 103 and the control circuit 104 are smaller in size than conventional waveform equalization circuits, the circuit size of devices including the A/D converter 11 (e.g., an optical disk reproduction device) can be reduced, and the power consumption thereof can also be reduced.

In addition, since the correction factors Dd and Du are each configurable by means of an external control CTRL, correction amounts to digital values of the digital signal De are adjustable.

(Variations of the Control Circuit)

A control circuit 104 may include an adder instead of a multiplier 113. Moreover, like the control circuit 104a shown in FIG. 5A, a multiplier 121, which multiplies the correction factors Dd and Du passed through the adder 112 by a set value SET configurable by means of an external control, may be provided. In addition, like the control circuit 104b shown in FIG. 5B, an adder 113a and a multiplier 113b, which respectively perform an addition operation and a multiplication operation on the correction factors and the digital values of the digital signal De, may be provided, and a selector 113c, which can switch between the respective outputs of the adder 113a and the multiplier 113b by means of an external control CTRL, may also be provided. In both cases of FIGS. 5A and 5B, correction amounts to digital values of the digital signal De can be adjusted by means of an external control. Note that the correction factors to be added to digital values of the digital signal De, or by which digital values of the digital signal De is multiplied, may be a fixed value. That is, the correction amounts to digital values of the digital signal De may be fixed values.

Embodiment 2

Figure 6:
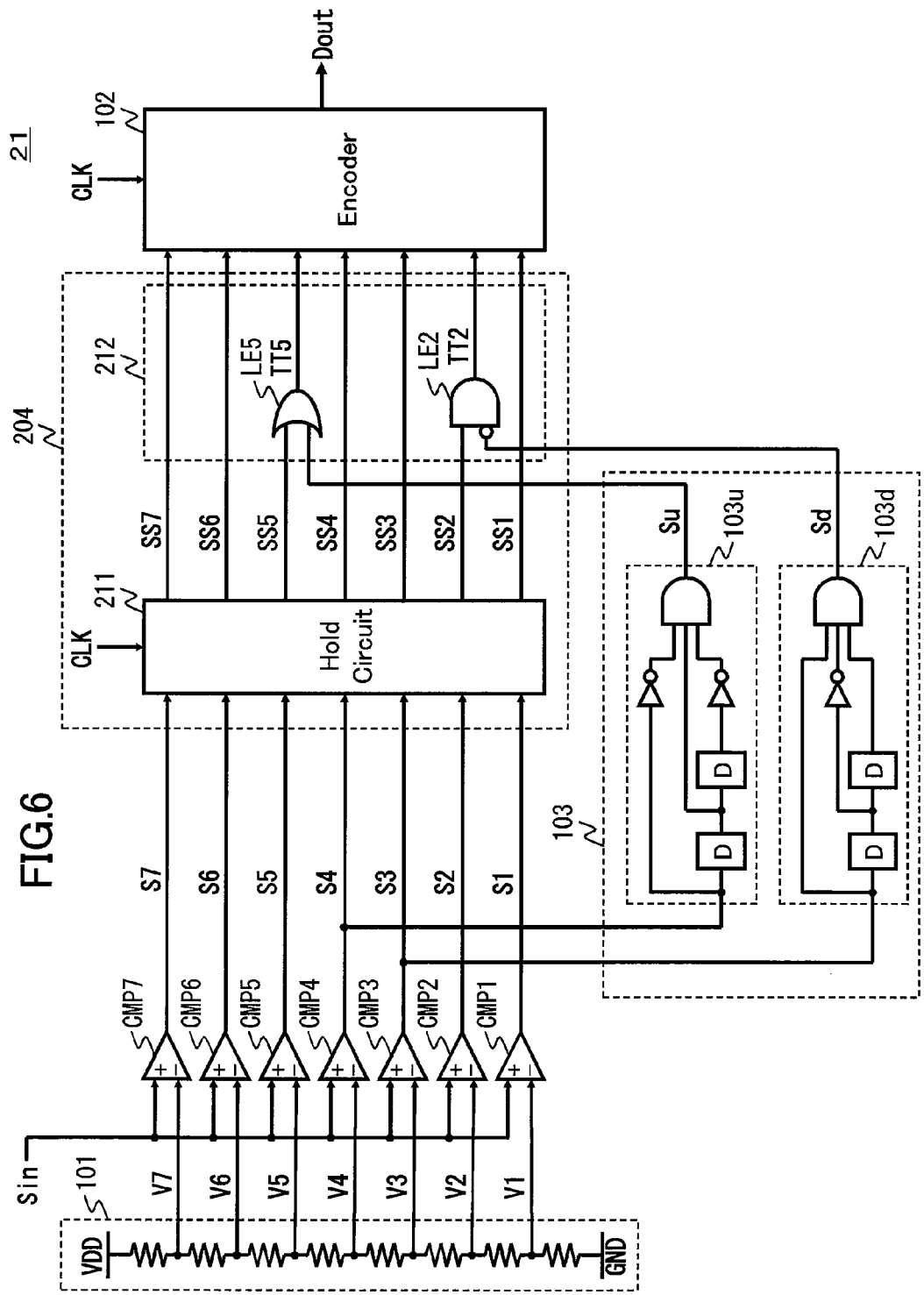
FIG. 6 is a diagram illustrating an example structure of an A/D converter in accordance with the embodiment 2.

FIG. 6 illustrates an example structure of an A/D converter 21 in accordance with the embodiment 2 of the present invention. This A/D converter 21 includes a control circuit 204 instead of the control circuit 104 shown in FIG. 1.

The control circuit 204 manipulates the comparison signals S1, S2, . . . , and S7 given to the encoder 102 in response to the detection signals Sd and Su, thereby changes digital values of the digital signal Dout generated by the encoder 102. The control circuit 204 includes a hold circuit 211 and an operation circuit 212. The hold circuit 211 holds the comparison signals S1, S2, . . . , and S7 in synchronization with a clock signal CLK, and outputs as output signals SS1, SS2, . . . , and SS7. The operation circuit 212 forcibly sets some of the output signals SS1, SS2, . . . , and SS7 from the hold circuit 211 to "1" or "0" in response to the detection signals Sd and Su. Here, the operation circuit 212 forcibly sets the output signal SS2 to "0" when the detection signal Sd is "1," and forcibly sets the output signal SS5 to "1" when the detection signal Su is "1." For example, the operation circuit 212 includes a logic circuit LE2, which performs an operation on the output signal SS2 and the detection signal Sd, and then outputs an output signal TT2, and a logic circuit LE5 (an OR circuit), which performs an operation on the output signal SS5 and the detection signal Su, and then outputs an output signal TT5.

The encoder 102 sequentially outputs digital values which correspond to input patterns indicated by respective signal levels of the output signals SS1, TT2, SS3, SS4, TT5, SS6, and SS7 from the control circuit 204, as the digital signal Dout.

[Operation]

Figure 7:
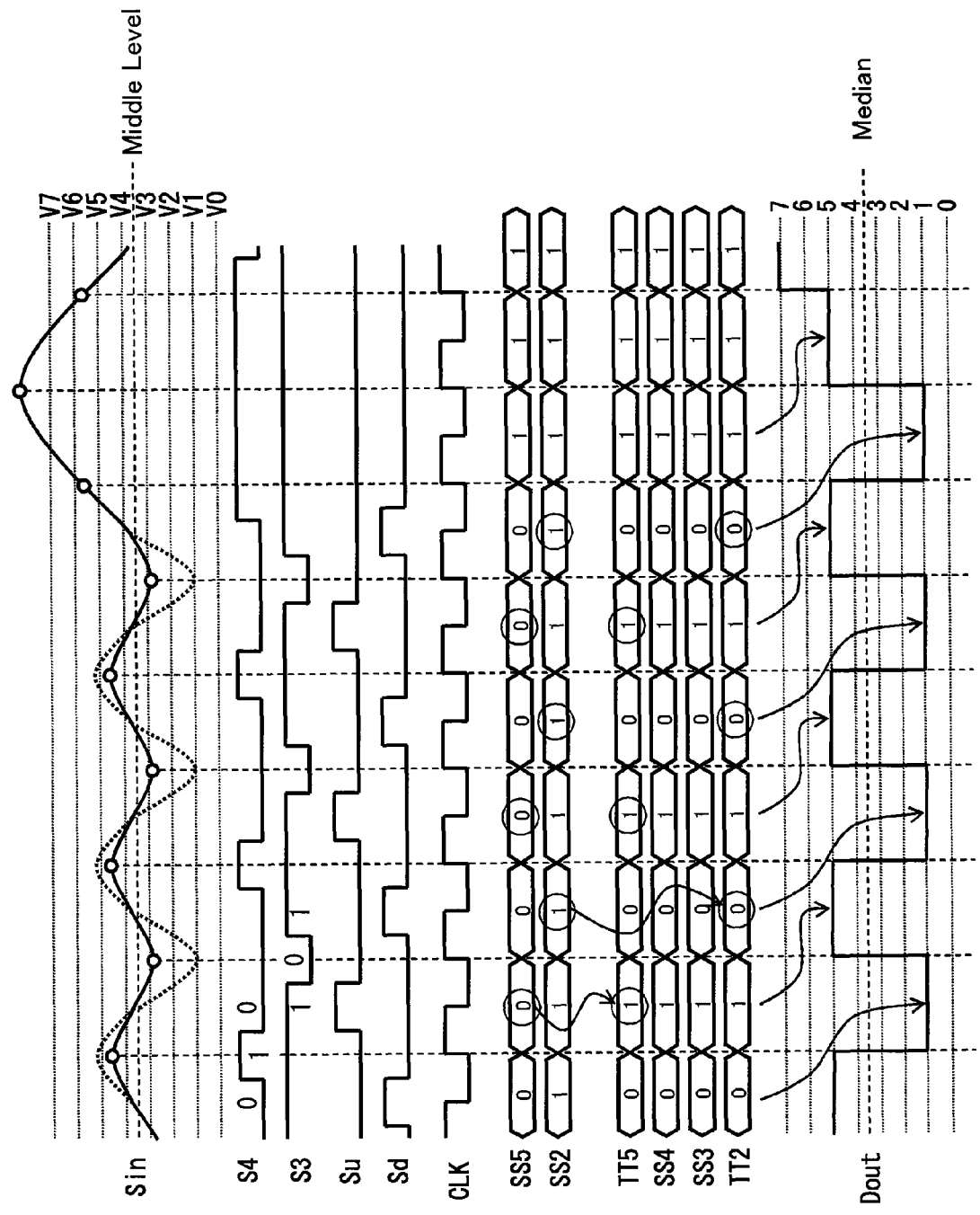
FIG. 7 is a timing chart for explaining the operation by the A/D converter shown in FIG. 6.

Next, referring to FIG. 7, operation of the A/D converter 21 shown in FIG. 6 will be described. Note that the processes by the comparators CMP1, CMP2, . . . , and CMP7, and by the pattern detection circuit 103 are similar to what are shown in FIG. 4.

When a temporal change of the comparison signal S4 represents a particular pattern "010," the detection signal Su changes from "0" to "1," causing the output signal TT5 to be forcibly set to "1," even if the output signal SS5 is "0." Accordingly, the encoder 102 outputs a digital value "5" instead of a digital value "4" as the digital signal Dout. Thus, digital values of the digital signal De can be increased with appropriate timing.

When a temporal change of the comparison signal S3 represents a particular pattern "101," the detection signal Sd changes from "0" to "1," causing the output signal TT2 to be forcibly set to "0," even if the output signal SS2 is "1." Accordingly, the encoder 102 outputs a digital value "2" instead of a digital value "3" as the digital signal Dout. Thus, digital values of the digital signal De can be decreased with appropriate timing.

During a time period where neither of the temporal changes of the comparison signals S3 and S4 represents a particular pattern, the detection signals Sd and Su are both "0," causing the output signals SS2 and SS5 to be directly output as the output signals TT2 and TT5.

As described above, by correcting the comparison signals given to the encoder 102 (the output signals SS1, TT2, SS3, SS4, TT5, SS6, and SS7) with appropriate timing, the waveform of the digital signal De can become a predetermined waveform.

Embodiment 3

Figure 8:
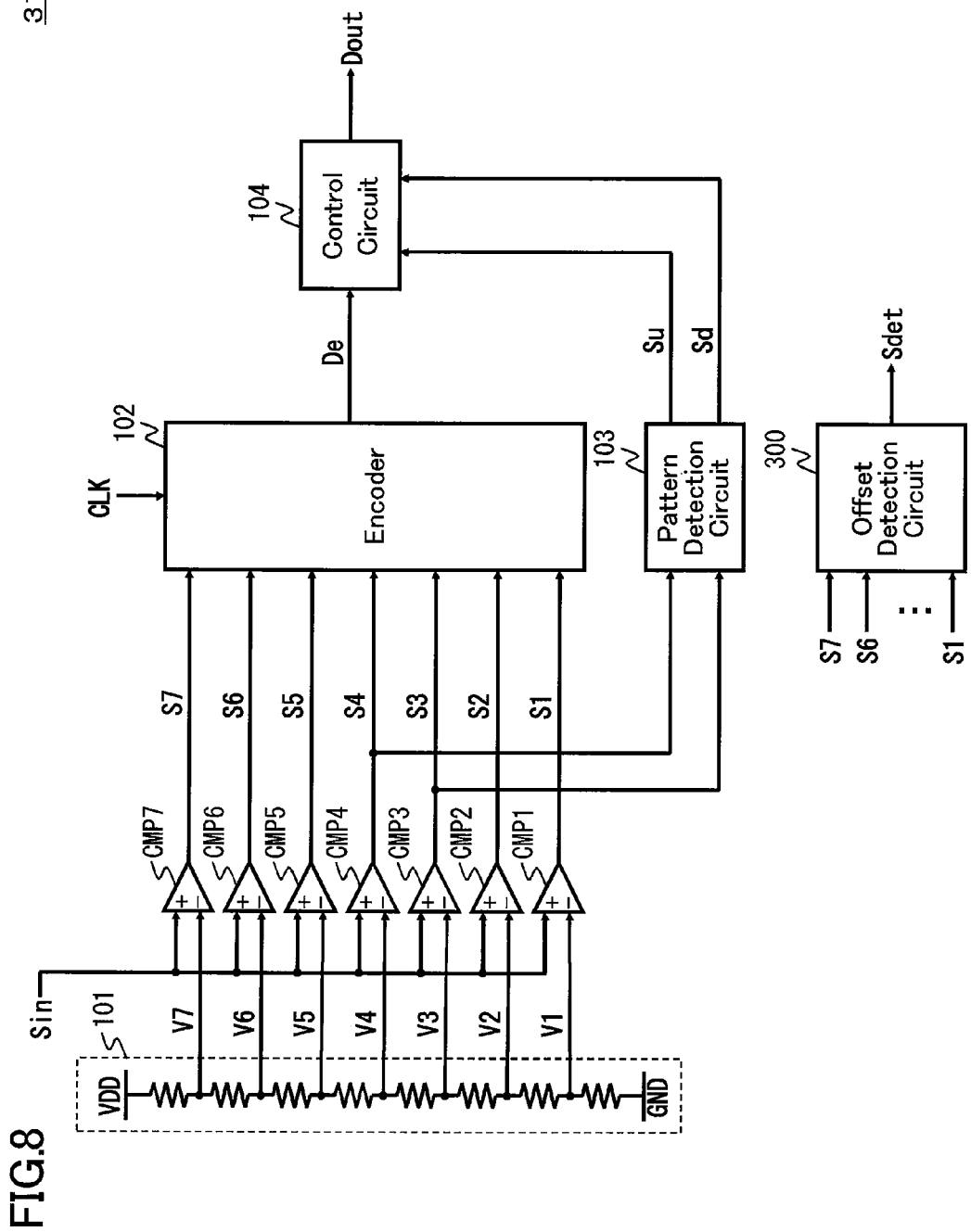
FIG. 8 is a diagram illustrating an example structure of an A/D converter in accordance with the embodiment 3.

FIG. 8 illustrates an example structure of an A/D converter 31 in accordance with the embodiment 3 of the present invention. This A/D converter 31 includes an offset detection circuit 300 in addition to the components shown in FIG. 1, and informs the outside of offset information Sdet about DC offset.

Figure 9:
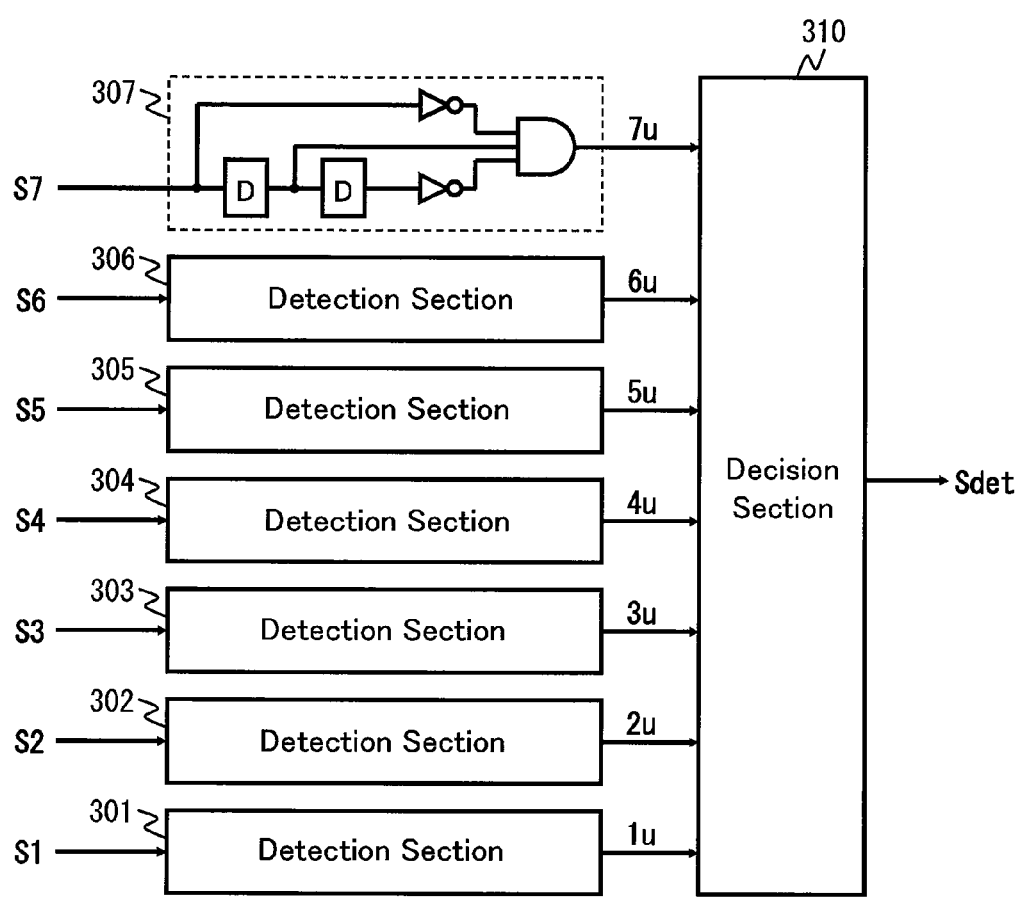
FIG. 9 is a diagram illustrating an example of the internal structure of the offset detection circuit shown in FIG. 8.

FIG. 9 illustrates an example structure of the offset detection circuit 300 shown in FIG. 8. The offset detection circuit 300 includes n (here, n=7) detection sections 301, 302, . . . , and 307, and a decision section 310. The detection sections 301, 302, . . . , and 307, each of which has a similar structure to the detection section 103u shown in FIG. 1, output detection signals 1u, 2u, . . . , and 7u when it is detected that temporal changes of the comparison signals S1, S2, . . . , and S7 match a particular pattern "010." The decision section 310 identifies which detection section of the detection sections 301, 302, . . . , and 307 has detected the particular pattern "010" based on the output statuses of the detection signals 1u, 2u, . . . , and 7u, and outputs to the outside the offset information Sdet indicating which comparator of the comparators CMP1, CMP2, . . . , and CMP7 corresponds to the identified detection section.

[Operation]

Figure 10:
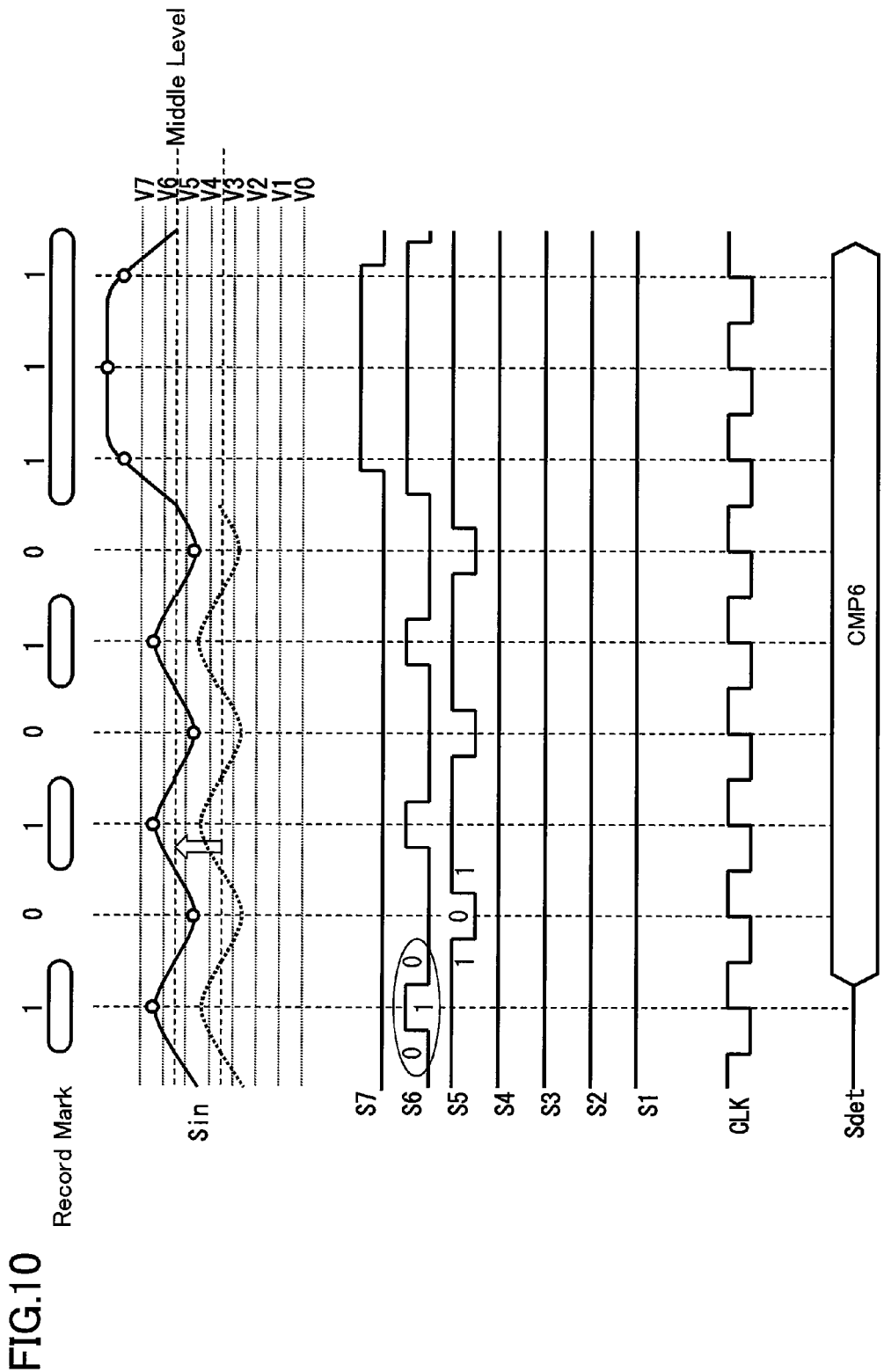
FIG. 10 is a timing chart for explaining the operation by the A/D converter shown in FIG. 8.

Next, referring to FIG. 10, an offset detection operation by the A/D converter 31 shown in FIG. 8 will be described. Note that the basic operation by the A/D converter 31 (analog-to-digital conversion process and waveform equalization process) is similar to what is shown in FIG. 4.

If no DC offset is occurring (the dotted wavy line in FIG. 10), the signal level of the analog signal Sin varies with "(V3+V4)/2" as a middle level. In this case, the temporal change of the comparison signal S4 represents the particular pattern "010."

On the other hand, if the middle level of the analog signal Sin has shifted from the initial middle level of "(V3+V4)/2" to "(V5+V6)/2" (the solid wavy line in FIG. 10) due to a DC offset, the temporal change of the comparison signal S6, not of the comparison signal S4, represents the particular pattern "010," causing the detection section 306 to output the detection signal 6u. The decision section 310 outputs to the outside the offset information Sdet indicating "the comparator CMP6 (the comparator corresponding to the detection section 306)" in response to the detection signal 6u. By referring to this offset information Sdet, it is possible to know the comparator, the temporal change of the output of which matches a particular pattern. Then, by obtaining differences between the reference voltages (the reference voltages V4 and V6) respectively corresponding to the comparator indicated in the offset information Sdet (the comparator CMP6) and to the comparator, the temporal change of the output of which matches a particular pattern if no DC offset is occurring (the comparator CMP4), the amount of the DC offset can be known.

As described above, the amount of the DC offset can be obtained based on the offset information Sdet. Note that each of the detection sections 301, 302, . . . , and 307 may detect a match with a particular pattern "101" instead of a particular pattern "010." In addition, the offset detection circuit 300 can be applied to the A/D converter 21 shown in FIG. 6.

Other Embodiments

Figure 11:
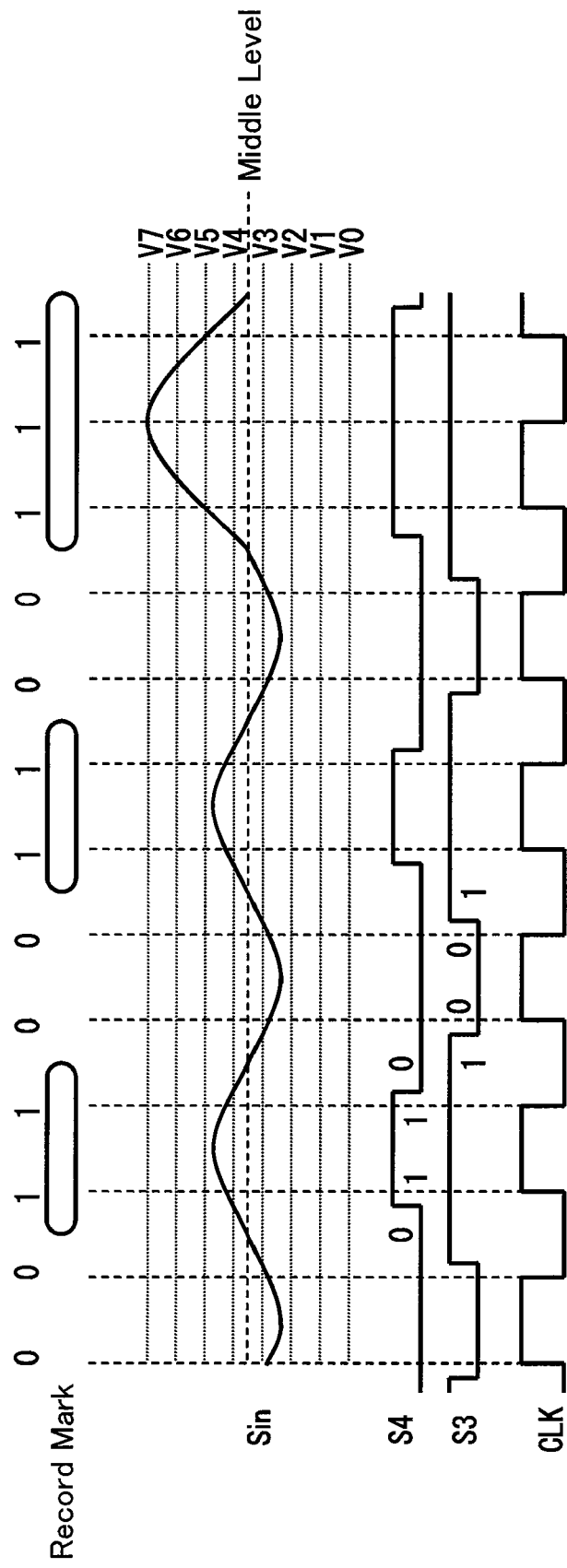
FIG. 11 is a diagram for explaining signal components of an analog signal.
Figure 12:
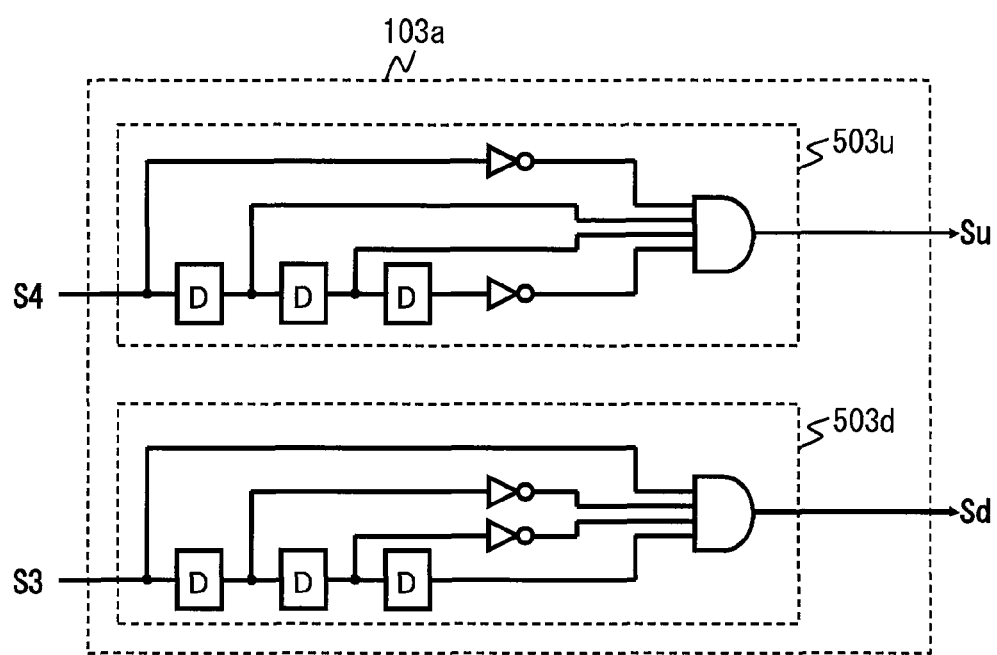
FIG. 12 is a diagram for explaining a variation of the pattern detection circuit.

In each embodiment described above, although explanation is given for a case where 2T signal component of the analog signal Sin is the target of the waveform equalization process, another signal component may be a target of the waveform equalization process. For example, in cases of a DVD, run-length of a modulated signal is limited so that the minimum run-length and the maximum run-length will be 3T and 11T respectively, and as shown in FIG. 11, the 3T signal component of the analog signal Sin (a reproduced signal) has the smallest amplitude. And, during a time period where the analog signal Sin is in a small amplitude state, the temporal changes of the comparison signals S3 and S4 represent particular patterns of "1001" and "0110" respectively. In this case, by using a pattern detection circuit 103a shown in FIG. 12, a match can be detected between the temporal change of the comparison signal S3 and the particular pattern "1001" in a detection section 503d, and a match can be detected between the temporal change of the comparison signal S4 and the particular pattern "0110" in a detection section 503u. In this way, a pattern detection circuit 103 can be designed as appropriate in accordance with the relationship between amplitude characteristics of the analog signal Sin and the temporal changes of the comparison signals S1, S2, . . . , and S7.

Figure 13:
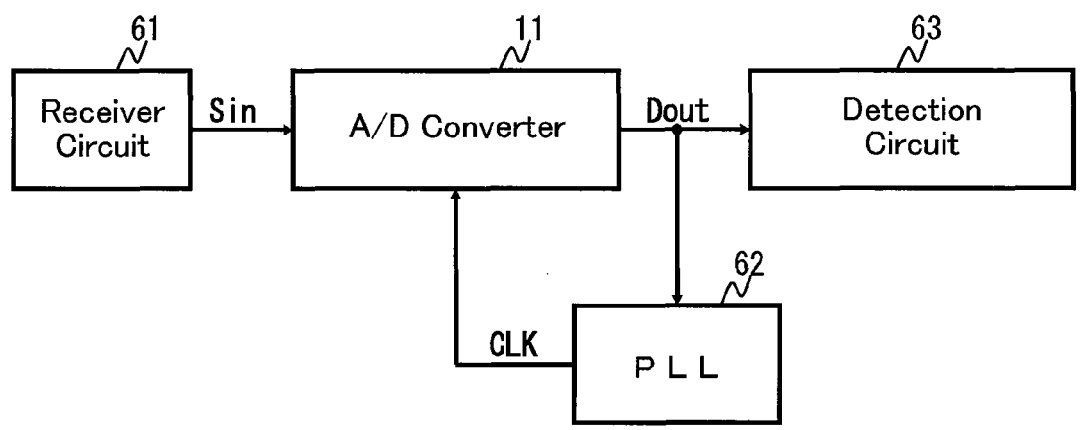
FIG. 13 is a diagram illustrating an example structure of a receiver device having the A/D converter shown in FIG. 1.

In addition, an A/D converter in accordance with each embodiment can be applied in a receiver device. A receiver device shown in FIG. 13 includes a receiver circuit 61, a PLL 62, and a detection circuit 63 in addition to the A/D converter 11 shown in FIG. 1. The receiver circuit 61 receives an analog signal from the outside. The A/D converter 11 converts the analog signal Sin from the receiver circuit 61 into a digital signal Dout. The PLL 62 generates a clock signal CLK synchronized with the analog signal Sin, based on the digital signal Dout from the A/D converter 11. The detection circuit 63 detects desired data from the digital signal Dout. Thus, applying an A/D converter in accordance with each embodiment to a receiver device allows for a reduction in circuit size and a reduction in power consumption of signal processing devices.

INDUSTRIAL APPLICABILITY

As described above, since above-mentioned A/D converters can perform not only analog-to-digital conversion process but also waveform equalization process, they are useful for signal processing devices such as optical disk reproduction devices and receiver devices.

The invention claimed is:

1. An A/D converter comprising:
    a plurality of comparators, which respectively correspond to a plurality of reference voltages which have different voltage levels, each configured to compare a reference voltage corresponding to the comparator with a signal level of an analog signal;
    an encoder configured to generate a digital signal corresponding to the analog signal based on outputs of the plurality of comparators;
    a pattern detection circuit configured to detect that a temporal change of an output of a first comparator of the plurality of comparators matches a predetermined first particular pattern;
    a control circuit configured to correct a digital value of the digital signal in response to detection by the pattern detection circuit, such that the waveform of the digital signal corresponds to a predetermined waveform;
    wherein the temporal change of the output of the first comparator becomes the first particular pattern when an amplitude of the analog signal is smaller than a predetermined amplitude.

2. The A/D converter of claim 1, wherein the pattern detection circuit includes
    a first detection section configured to detect that the temporal change of the output of the first comparator matches the first particular pattern, and
    a second detection section configured to detect that a temporal change of an output of a second comparator, corresponding to a reference voltage lower than the reference voltage of the first comparator, of the plurality of comparators matches a predetermined second particular pattern,
    the temporal change of the output of the first comparator becomes the first particular pattern when a maximum peak of the amplitude of the analog signal is lower than a maximum peak of the predetermined amplitude,
    the temporal change of the output of the second comparator becomes the second particular pattern when a minimum peak of the amplitude of the analog signal is higher than a minimum peak of the predetermined amplitude,
    the control circuit increases the digital value in response to the detection by the first detection section, and decreases the digital value in response to the detection by the second detection section.

3. The A/D converter of claim 1, wherein the control circuit corrects the digital value by adding to, or by multiplying by, a predetermined correction factor.

4. The A/D converter of claim 3, wherein the correction factor is variable.

5. The A/D converter of claim 1, wherein the control circuit corrects the digital value by manipulating outputs of the plurality of comparators supplied to the encoder.

6. The A/D converter of claim 1, further comprising an offset detection circuit configured to detect a comparator, of the plurality of comparators, a temporal change of the output of which matches the first particular pattern, and to output the detection result as offset information.

7. An optical disk reproduction device configured to reproduce information recorded on an optical disk, comprising:
    a reproduction circuit, and
    the A/D converter of claim 1,
    wherein the reproduction circuit reproduces information recorded on the optical disk as an analog signal, and the A/D converter converts the analog signal reproduced by the reproduction circuit into the digital signal.

8. An optical disk reproduction device of claim 7, wherein the optical disk is any one of a CD, a DVD, and a Blu-ray disk.

9. A receiver device configured to receive and process an analog signal from the outside, comprising:
    a receiver circuit, and
    the A/D converter of claim 1,
    wherein the receiver circuit receives the analog signal from the outside, and the A/D converter converts the analog signal received by the receiver circuit into the digital signal.

* * * * *